US010444521B2

United States Patent
Rudolf et al.

(10) Patent No.: US 10,444,521 B2
(45) Date of Patent: Oct. 15, 2019

(54) DEVICE FOR MACHINING MATERIAL BY MEANS OF LASER RADIATION

(71) Applicant: PRECITEC GMBH & CO. KG, Gaggenau-Bad Rotenfels (DE)

(72) Inventors: Andreas Rudolf, Kuppenheim (DE); Martin Schönleber, Aschaffenburg (DE)

(73) Assignee: PRECITEC GMBH & CO. KG, Gaggenau (DE)

(*) Notice: Subject to any disclaimer, the term of this patent is extended or adjusted under 35 U.S.C. 154(b) by 0 days.

(21) Appl. No.: 15/547,036

(22) PCT Filed: Jan. 27, 2016

(86) PCT No.: PCT/EP2016/051702
§ 371 (c)(1),
(2) Date: Jul. 27, 2017

(87) PCT Pub. No.: WO2016/120327
PCT Pub. Date: Aug. 4, 2016

(65) Prior Publication Data
US 2017/0371166 A1 Dec. 28, 2017

(30) Foreign Application Priority Data
Jan. 28, 2015 (DE) .......... 10 2015 101 263

(51) Int. Cl.
*G02B 27/12* (2006.01)
*G02B 27/09* (2006.01)
(Continued)

(52) U.S. Cl.
CPC ........ *G02B 27/0972* (2013.01); *B23K 26/067* (2013.01); *B29C 65/1635* (2013.01);
(Continued)

(58) Field of Classification Search
CPC .. G02B 27/0972; G02B 6/4214; G02B 26/02; G02B 6/34; B29C 65/1635;
(Continued)

(56) References Cited

U.S. PATENT DOCUMENTS

| 3,726,595 A | 4/1973 | Matsumoto |
| 5,548,444 A | 8/1996 | McLaughlin |

(Continued)

FOREIGN PATENT DOCUMENTS

| DE | 2821883 B1 | 10/1979 |
| DE | 4430220 A1 | 2/1996 |

(Continued)

OTHER PUBLICATIONS

Notification of Reasons for Refusal for Japanese Patent Application No. JP 2017-539636, dated Feb. 6, 2018, 4 Pages (With English Translation).

*Primary Examiner* — Alicia M Harrington
(74) *Attorney, Agent, or Firm* — Fenwick & West LLP

(57) ABSTRACT

A device for machining material by means of laser radiation, including a focusing optics for focusing a laser beam onto a workpiece and an adjusting optics for adjusting the intensity distribution comprising at least two plate-shaped optical elements which are arranged one behind the other in the beam path of the laser beam, which are rotatable relative to one another in the circumferential direction, and which each have a surface with a circular pattern of sector-shaped facets which, in the circumferential direction, are alternately inclined with respect to the respective plate plane.

19 Claims, 7 Drawing Sheets

(51) Int. Cl.
- *B23K 26/067* (2006.01)
- *B29C 65/16* (2006.01)
- *F21V 5/02* (2006.01)
- *F21V 7/05* (2006.01)
- *F21V 13/04* (2006.01)
- *H01L 33/58* (2010.01)
- *B23K 26/38* (2014.01)
- *G02B 27/42* (2006.01)
- *B23K 26/21* (2014.01)

(52) U.S. Cl.
CPC ............... *F21V 5/02* (2013.01); *F21V 7/05* (2013.01); *F21V 13/04* (2013.01); *G02B 27/0927* (2013.01); *G02B 27/0938* (2013.01); *H01L 33/58* (2013.01); *B23K 26/21* (2015.10); *B23K 26/38* (2013.01); *G02B 27/4255* (2013.01)

(58) Field of Classification Search
CPC ......... B23K 26/067; H01L 33/58; F21V 7/05; F21V 5/02; F21V 13/04; A61N 2005/067; A61N 2007/0095; H01S 2301/20; H01S 3/005; H01S 3/0606; H01S 3/093
See application file for complete search history.

(56) References Cited

U.S. PATENT DOCUMENTS

| | | | |
|---|---|---|---|
| 8,237,085 | B2 | 8/2012 | Tanaka |
| 2002/0017509 | A1* | 2/2002 | Ishide ............... B23K 26/0604 219/121.63 |
| 2005/0098260 | A1 | 5/2005 | Chen |
| 2007/0139798 | A1 | 6/2007 | Epstein |
| 2007/0258077 | A1* | 11/2007 | Tanaka ............... G02B 27/0905 355/71 |
| 2008/0118203 | A1 | 5/2008 | Tanaka |

FOREIGN PATENT DOCUMENTS

| | | |
|---|---|---|
| DE | 102011113980 A1 | 3/2013 |
| DE | 102012008940 A1 | 11/2013 |
| DE | 102013102442 A1 | 9/2014 |
| DE | 102014105941 A1 | 11/2014 |
| EP | 2760622 | 3/2014 |
| JP | S50-23617 | 3/1975 |
| JP | 2005-125783 | 5/2005 |
| JP | 2007-245194 | 9/2007 |
| JP | 2009-521782 | 6/2009 |
| JP | 2013-505473 | 2/2013 |
| JP | 2015-527147 | 9/2015 |
| WO | WO-95/18984 | 7/1995 |
| WO | WO-2013/086227 A1 | 6/2013 |

* cited by examiner

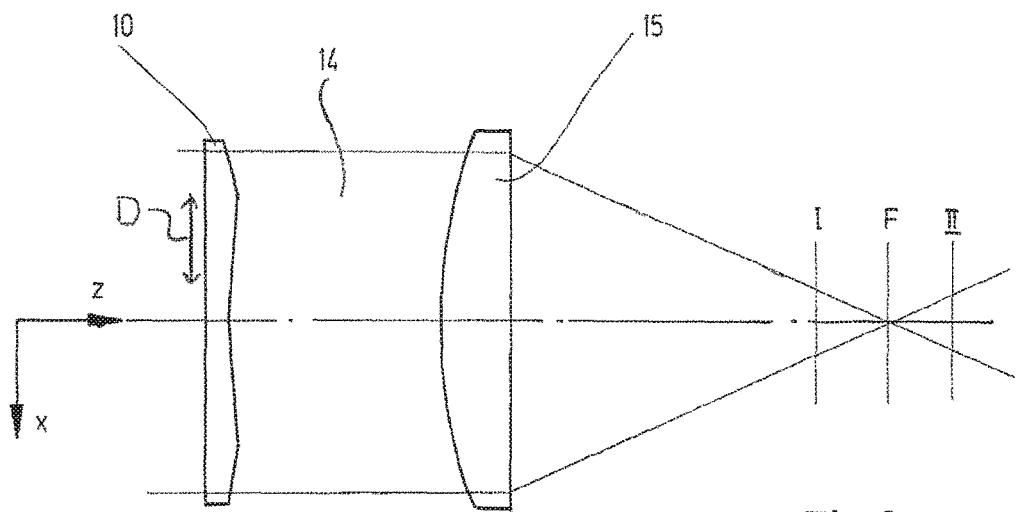
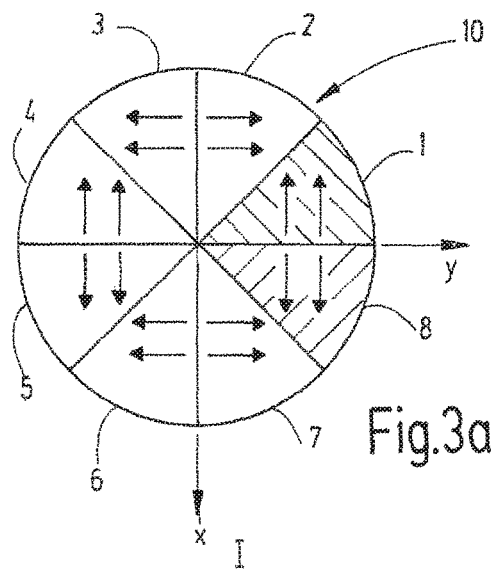 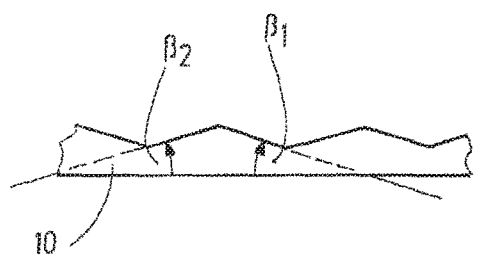
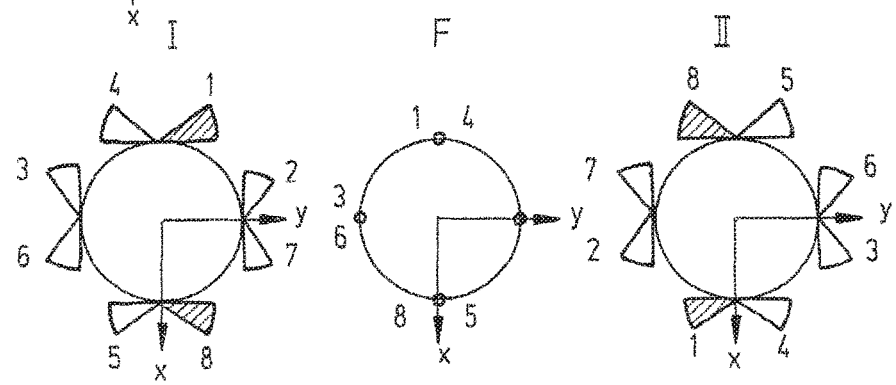

| Configuration | Intensity profile at the axial distance z from the focal plane, image excerpt 1.6 mm x 1.6 mm | | | Description/evaluation |
| --- | --- | --- | --- | --- |
| | z = -3 mm | z = 0 mm | z = 3 mm | |
| #1 Without beamforming optics | | | | Usual focusing with beam widening before and after |
| #2 Siemens-star optics | | | | Annular profiles with very similar O over the entire z-range. Due to 32-fold faceting, the azimuthal intensity fluctuations are low, especially outside the focal plane. |
| #3 Axicon | | | | Focusing the beam before the actual focal plane. From the focal plane on angular profile, the diameter of which increases sharply with increasing z-distance. |
| #3 Fibre with annular core | | | | Annular profile is achieved only in a very narrow z-vicinity of the focal plane. Before and after Gauss-like beam profile. |

FIG. 8

| Angular offset element 2 [number of facets] | Side view (with exaggerated facet angles) | Spot shape [Annular Ø in µm] | Proportion of power [%] | Intensity profile at z=0 mm focal plane (1x1mm) | Intensity profile at z=0.35 mm (1x1mm) |
|---|---|---|---|---|---|
| 0 | | 600/0 | 98/2 | | |
| 0,33 | | 600/0 | 68,5/31,5 | | |
| 0,5 | | 600/0 | 51,5/48,5 | | |
| 0,66 | | 600/0 | 35,2/64,8 | | |
| 1 | | 600/0 | 0,1/99,9 | | |
| Without Siemens stars | | 0 | 100 | | |

FIG. 9

| Angular offset element 2 [number of facets] | Angular offset element 3 [number of facets] | Spot shape [Annular Ø in µm] | Proportion of power [%] | Intensity profile at z=0mm focal plane (1x1mm) | Intensity profile at z=0.35mm (1x1mm) |
|---|---|---|---|---|---|
| 0 | 0 | 600/0 | 98/2 | | |
| 1 | 0 | 300/0 | 98/2 | | |
| 0 | 1 | 300/0 | 98/2 | | |
| 1 | 1 | 0 | 100 | | |
| 0,5 | 1 | 300/0 | 50/50 | | |
| 1 | 0,5 | 300/0 | 50/50 | | |
| 0 | 0,5 | 600/300 | 50/50 | | |
| 0,5 | 0 | 600/300 | 50/50 | | |

FIG. 10A

| Angular offset element 2 [number of facets] | Angular offset element 3 [number of facets] | Spot shape [Annular Ø in μm] | Proportion of power [%] | Intensity profile at z=0mm focal plane (1x1mm) | Intensity profile at z=0.35mm (1x1mm) |
|---|---|---|---|---|---|
| 0,5 | 0,5 | 600/0 | 50/50 | | |
| 0,33 | 0,66 | 600/300/0 | 33/33/33 | | |
| 0,66 | 0,33 | 600/300/0 | 33/33/33 | | |
| 0,33 | 0 | 600/300 | 66/33 | | |
| 0 | 0,33 | 600/300 | 66/33 | | |
| 0,66 | 0 | 600/300 | 33/66 | | |
| 0 | 0,66 | 600/300 | 33/66 | | |
| Without Siemens star optics | | 0 | 100 | | |

FIG. 10B

DEVICE FOR MACHINING MATERIAL BY MEANS OF LASER RADIATION

BACKGROUND OF THE INVENTION

Field of the Invention

The invention relates to a device for machining material by means of laser radiation.

Brief Discussion of the Related Art

During laser machining, i.e., machining material by means of laser radiation, such as laser welding or laser cutting, the laser beam emitted from a laser light source, for example, the end of a laser fibre, is focused on the workpiece to be machined by means of beam guiding and focusing optics. The diameter of the focus, that is, the diameter of the image of the laser light source on the workpiece, results from the optical data of the individual optical elements of the guiding and focusing optics. If, as is typical, a beam guiding and focusing optics with a collimator optics and a focusing optics is used, which the laser light is supplied to via an optical fibre, the focus diameter results from the product of the fibre core diameter and the focusing focal length divided by the collimation focal length.

Depending on the thickness of the sheet, different laser beam diameters are required for laser cutting. Here, the larger the thickness of the material to be cut, the greater the laser beam diameter should be. For example, a focus diameter of approx. 125 µm is used up to a sheet thickness of 5 mm, while for cutting sheets with a thickness of 5 mm to 10 mm a focus diameter which is twice as great, i.e., a focus diameter of approximately 250 µm, is desired. From sheet thicknesses of 10 mm on, guide and focusing optics are used which provide a focus diameter of approximately 600 µm or more. However, high cutting edge quality can only be achieved custom beam caustics. Otherwise, grooves, ridges and burrs are formed at the cutting edge.

In the case of large focus diameters, it is advantageous to form an annular profile of the intensity distribution in the focus since this results in a more homogeneous temperature distribution in the cutting kerf. As a result, the molten material can be driven out more efficiently by the cutting gas.

DE 28 21 883 C2 already discloses a device for machining material, such as drilling, punching and welding material, by means of laser beams, in which, between a collimator optics for widening the laser beam and a focusing system for focusing the laser beam onto a workpiece, a cone (axicon) consisting of a transparent refractive material for axisymmetric inversion of the cross-section areas of the laser machining beam remote from the axis and close to the axis is obtained. The focusing optics then focuses the laser machining beam according to its changed beam characteristics into an annular region on the workpiece. By using the axicon, the intensity distribution in the laser machining beam is thus changed such that an annular profile arises in the focus region.

In the optical device known from DE 10 2013 102 442 A1 for use in laser material machining, two refractive optics are provided between a focusing optics and collimator optics which can be displaced transversely with respect to the laser beam. Herein, the refractive optics are configured as plate-like elements, the mutually facing surfaces of which are shaped in such a way that an axicon with a variable cone angle can be simulated by the displacement. Thereby, both a top-hat profile and an annular profile can be produced. The ring diameter can be adjusted continuously.

A device is known from WO 2013/086227 A1 in which the beam characteristic in the focus on the workpiece is not obtained by an intervention in the beam guiding and focusing optics, but in which the beam characteristics is obtained at the laser light outlet end of an optical fibre supplying the laser radiation to the beam guiding and focusing optics. For this purpose, the laser beam is coupled into the process fibre at different angles by means of a displaceable coupling device in order to excite only a few of the fibre modes. As a result, a Gaussian/top-hat profile as well as an annular profile can be produced. The ring diameter can also be adjusted continuously. Here, the physical characteristic of an optical fibre that the numerical aperture on the inlet side is equal to the numerical aperture on the outlet side of the fibre is utilized.

Furthermore, reflective glass plates having circumferential or azimuthal phase ramps which form a sawtooth profile in the circumferential direction have already been proposed. The saw tooth profile is more inclined on the inside than on the outside. With such elements, a ring with a fixed diameter can be produced.

DE 10 2011 113 980 A1 discloses a lens system with variable refractive power in which two plano-convex lenses are arranged rotatably about the optical axis with their planar surfaces on top of each other. In this case, the convex lens surfaces are each provided with a helix-like curvature profile with a refractive power which continuously increases or decreases as a function of the angle about the axis of rotation and with at least one azimuthal refractive power step at a respective zero angle. During the rotation of the lenses with respect to one another, the refractive power, and thus the focal length of the pair of lenses, changes. The azimuthal steps must be covered.

US 2007/0139798 A1 relates to an LED emitter with a radial prismatic light diverter. The radial prismatic light diverter, which is arranged in the main emission direction in front of the LED, comprises, on the side facing away from the LED, a surface with a circular pattern of sector-shaped facets, which, in the circumferential direction, are alternately inclined with respect to the respective plate plane.

Furthermore, it is known that problems in laser welding such as the formation of spatter and pores can be reduced by rapid, periodic deflection of the operating laser beam.

For example, a laser machining head is known from WO 2014/038395 A1, wherein a wedge plate rotated by a motor is arranged in the beam path in order to guide the operating laser beam onto a circular path DE 10 2012 008 940 A1 discloses a further laser machining head is known wherein a second movement with an oscillating movement component in the x direction is superimposed on the advancing velocity of the laser beam in the y direction, so that the laser beam, for machining the workpiece, crosses it on a circle-like path.

In a laser machining head known from U.S. Pat. No. 8,237,085 B2, the intensity distribution of the laser beam is temporally averaged by oscillating mirrors in a direction perpendicular to the beam axis.

DE 44 30 220 A1 discloses an oscillating mirror machining head into which a focusing mirror, a planar mirror and a galvanometer scanner are integrated. A laser beam is focused by the focusing mirror and directed onto a workpiece via the planar mirror, which is controlled by the galvanometer scanner. The laser beam formation is performed by the galvanometer scanner on the basis of a sinusoidal, harmonic beam oscillation as driving function to control the intensity distribution on the workpiece.

DE 10 2014 105 941 A1 describes a method for laser beam welding in which the laser beam performs a spatially oscillating movement in parallel and/or perpendicular to the welding seam during welding, and the solidification of the melting bath is controlled by an additional temporal oscillation of the laser beam intensity and/or the laser beam collimation performed synchronously with the spatial oscillation. Herein, the temporal oscillations of the laser beam energy are achieved by varying the laser power of the beam source and/or by adjusting a collimation in the axial beam direction, i.e., widening or focusing the light beam.

SUMMARY OF THE INVENTION

The invention is based on the object of providing a device and a method for machining material by means of laser radiation, with the aid of which both the focus diameter and the beam characteristics, in particular in the focus region, i.e., the energy distribution in the focus region, can be changed during operation without exchanging components of the guiding and focusing optics.

This object is achieved according to the invention by the device for machining material by means of laser radiation according to claim 1 and the method according to claim 20. Advantageous embodiments and further developments of the invention are described in the respective dependent claims.

According to the invention, the device for machining material by means of laser radiation comprises at least one plate-shaped optical element in the beam path of the laser beam, one surface of which is provided with a circular pattern of sector-shaped facets which, in the circumferential direction, are alternately inclined with respect to the respective plate plane. With such an optical element, the laser focus is split in the beam plane into a plurality of points, which are arranged annularly about the optical axis of the beam path. If the plate-shaped optical element is then moved into and out of the beam path of the laser beam, a power density distribution of the laser beam in the beam plane can be switched between point distribution (spot) and annular distribution (annulus).

According to a further aspect of the invention, the device for machining material by means of laser radiation comprises at least two plate-shaped optical elements, which are arranged one behind the other in the beam path and are rotatable with respect to one another in the circumferential direction. The plate-shaped optical elements each comprise a surface with a circular pattern of sector-shaped facets, which, in the circumferential direction, are alternately inclined with respect to the respective plate plane. The narrow sector-shaped and preferably planar facets thus alternately form wedge-shaped plate sectors which deflect corresponding sector-shaped regions of the laser beam bundle in opposite directions.

Depending on the angular position of the two plate-shaped optical elements with respect to each other, a point-like intensity distribution or an annular intensity distribution in the focal point or in the focal plane of the focussing optics can be generated with the adjusting optics according to the invention. According to the invention, it is therefore also possible to switch between annular profile and Gaussian/top-hat profile by rotating the plate-shaped optical elements with respect to one another during laser beam machining, so that sheets with different material thicknesses can also be produced in one operating step or directly consecutively without changing the beam guiding and focusing optics of a laser machining head.

Although it is in principle conceivable that the sector-shaped facets have different widths, it is advantageous if all the sector-shaped facets of a plate-shaped optical element have the same azimuthal width.

The surfaces of the sector-shaped facets of the plate-shaped optical elements of the adjusting optics are planar or curved or have two or more differently inclined portions.

Advantageously, the two plate-shaped optical elements of the adjusting optics are provided facing each other with their sector-shaped facet patterns, wherein the two plate-shaped optical elements of the adjusting optics are rotatable about an axis which is coaxial with a central axis of a laser beam bundle and wherein the sector-shaped facet patterns of the two plate-shaped optical elements of the adjusting optics have the same number of facets, and provision is made that the facet surfaces are inclined by the same angle. Such an arrangement makes it possible to ensure to that the surfaces of the two optical elements which carry the sector-shaped facet patterns face each other at a very small distance so that the beam deflections of the two surfaces ideally complement or cancel each other depending on the angular position of the optical elements. As a result, it is possible to obtain a point profile (Gaussian/top-hat) which is as good as possible as well as an annular profile which is as clean as possible.

In an advantageous development of the invention, provision is made so that the adjusting optics comprises a further plate-shaped optical element with a sector-shaped facet pattern. The further plate-shaped element may have the same properties as the first two. In order to be able to vary the energy distribution in the focal plane in as many different ways as possible, provision is made, in particular, so that the further plate-shaped optical element comprises a sector-shaped facet pattern which is different from the sector-shaped facet pattern of the first two plate-shaped optical elements.

In this case, the facet surfaces of the further plate-shaped optical element may be inclined by an angle with respect to the plate plane which is different from the inclination angle of the first two plate-shaped optical elements, in particular as large as the sum of the inclination angles of the first two plate-shaped optical elements. By combining three plate-shaped optical elements with sector-shaped facet patterns in the beam bundle of a laser machining beam, two different annular profiles may be combined with one another so that the beam characteristics, i.e., the intensity distribution in the laser beam bundles can be varied over a wide range depending on which intensity distribution is desired for a current material machining.

Furthermore, it is possible that the facets of the further plate-shaped optical element have an azimuthal width which is different from the azimuthal width of the facets of the two first plate-shaped optical elements.

Advantageously, provision is made so that the inclination angle of the facet surfaces with respect to the plate plane is between ±0.1° and ±0.6°.

A particularly uniform distribution of the laser energy in an annular profile may be achieved if the even number of the facets is 18 to 72, preferably 24 to 40, in particular 36.

Although, in principle, it is possible to arrange the adjusting optics according to the invention also in the divergent or convergent regions of a laser beam, provision is made according to the invention so that collimator optics is provided for widening the laser beam and that the Siemens star optics is arranged between the collimator optics and the focussing optics.

In an advantageous embodiment of the invention provision is made so that a rotary drive is assigned to at least one of the plate-shaped optical elements so that the plate-shaped optical elements can be driven during a laser machining process so as to rotate at a constant or variable speed.

If the adjusting optics comprises two or more plate-shaped optical elements, the power density distribution of the laser beam can thereby be periodically varied, whereby a quasi-continuous beam widening in the focus is achieved when correspondingly high modulation frequencies are used.

If only one plate-shaped optical element is present, the power density distribution of the laser beam cannot be modulated by the rotation of the plate-shaped optical element, but, advantageously, it is possible to homogenize the power density distribution in the annular profile in the circumferential direction since the annular profile itself rotates in a plane parallel to the plane of the plate-shaped optical element, i.e., since the individual light spots of the annular profile substantially revolve around the optical axis. Herein, the temporal distribution of the power density in one point of the annular profile corresponds to the spatial distribution in the circumferential direction. This not only compensates for differences in power density caused by the point structure but also differences based on manufacturing tolerances.

Advantageously, a respective rotary drive is assigned to each of the plate-shaped optical elements, the rotary drives being independently drivable so that the rotational speed and direction of rotation of each of the plate-shaped optical elements can be selected freely. With such a device, the power density distribution of the laser beam can be varied both temporally via the rotational to speeds and spatially via the selected geometric structure of the sector-shaped facets and the activation or deactivation of the individual rotary drives.

During machining material by means of laser radiation using a device according to the invention, advantageously at least one of the plate-shaped optical elements is rotated at constant or variable speed during laser machining in order to vary a power density distribution with a desired modulation frequency.

Advantageously, provision may be made so that both of the at least two plate-shaped optical elements are rotated in opposite directions at the same or different speeds so that the modulation of the power density distribution can be adapted to the respective requirements of the machining task.

In order to be able to vary not only the power density distribution but also the power itself during laser machining, the output power of the laser is modulated while one or more of the plate shaped optical elements are rotated, a modulation frequency of the laser being coupled to the modulation frequency of the power density distribution.

BRIEF DESCRIPTION OF THE DRAWINGS

Hereinafter, the invention is explained in more detail by way of example with reference to the drawing. In the figures:
FIG. 2 is a schematic diagram of a focusing optics for focusing a parallel bundle of rays, wherein a single plate-shaped optical element of an adjusting optics is arranged in the bundle of rays,
FIG. 3a shows a schematic plan view of a simplified plate-shaped optical element of an adjusting optics with eight facets,
FIG. 3b is a side view (developed view) of a plate-shaped optical element for an adjusting optics according to the invention,
FIG. 4 shows schematic diagrams of the beam characteristics before the focal plane, in the focal plane, and after the focal plane.

FIG. 8 show a result of simulation for different configurations of beam optics.

FIG. 9 shows results of simulating various angles between two plate-shaped Siemens star optics.

FIGS. 10A and 10B show results of simulating three optical elements having Siemens-star-shaped facets.

In the figures, corresponding components are provided with the same reference signs.

DETAILED DESCRIPTION OF THE PREFERRED EMBODIMENTS

Figure 1:
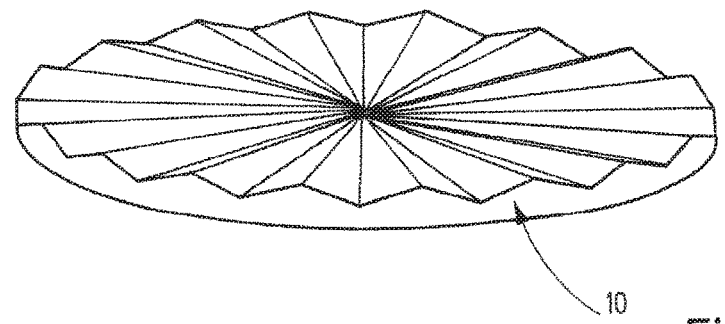
FIG. 1 shows a perspective view of a plate-shaped optical element with a Siemens star geometry in which the inclination angle of the facet surfaces is shown in an exaggerated manner.

FIG. 1 shows a plate-shaped optical element 10 which consists of a transparent disc, in particular of a plane glass made of quartz glass or zinc sulphide, which has, on one side, Siemens star-like facets which are inclined in the azimuthal or circumferential direction. Thus, the facets are narrow sectors or circular sectors, which, similar to the circular test pattern known as Siemens star, which alternately has white and black sectors, also have an alternating inclination in the circumferential direction. Two adjacent facets thus form a roof shape or a V-shaped valley shape, wherein two facets, which together form a roof shape, each form a V shape with their other adjacent facets. The plate-shaped optical element with the facets arranged in the shape of a Siemens star will hereinafter be referred to as Siemens star optics in accordance with the known Siemens star for testing imaging qualities.

Together with the plane counterface, the facet surface of each sector forms a wedge plate with a uniform beam deflection of the assigned circular sector of the collimated beam. In the drawing, the inclination angles of the facets are shown in an exaggerated manner, i.e. at ±15°. The facets, i.e., the sectors, each cover an angular range of 10° in the azimuthal or circumferential direction. This results in a total of 36 facets, i.e., 18 facets per inclination angle in the full circle.

If a Siemens star optics is arranged in the widened parallel beam path 14 of a laser beam source (not shown) in front of a focusing optics 15, as shown in FIG. 2, an annular focus image composed of individual light points (so-called spots) is produced in the focal plane F of the focusing optics 15. The individual spots, which stem from the individual facets, are shown in a more or less blurred manner in the planes I before the focal plane and II after the focal plane.

In the following, a highly simplified Siemens star geometry with eight sector-shaped facets is described. According to FIG. 3a, the Siemens star optics 10 includes eight facets 1 to 8, which are inclined in such a way that a roof line is located between the facets 1 and 2, 3 and 4, 5 and 6, 7 and 8, while a valley line is located between the facets 2 and 3, 4 and 5, 6 and 7, 1 and 8. The respective inclination angles β1, β2 are thus alternately positive and negative, as shown in FIG. 3. The inclination is thereby determined with respect to the plane of the plate, that is, with respect to the plane of the planar side of the plate-shaped Siemens star optics 10.

The collimated laser beam 14 falls onto the Siemens star optics 10 in FIG. 2 and is then focused into the focusing plane F by the focusing lens 15. The faceting shown in FIG. 3a results in a segment-wise deflection of the beam in different directions. FIG. 4 shows the beam profiles before (plane I), in (focal plane F) and after (plane II) the focal plane F. In the beam profiles before and after the focal plane F, the triangular shape of the facets is apparent due to defocusing, while the beam profile in the focus itself is composed of individual points or spots.

The deflection angle θ caused by the refraction of the preferably collimated laser beam 14 at an inclined facet is calculated from the inclination angle β and the refractive index n of the material used. The deflection angle θ is thus θ=β(n−1). This formula applies under the assumption that the small angle approximation (sin φ≈tan φ≈φ) is sufficiently valid, which is provided up to an angle of about 5°. The annular diameter in the focus is calculated from the deflection angle θ and the focal focus f:

Annular Ø=2·f·tan θ. Here are some examples:

| Facet inclination angle β | 0.1° | 0.2° | 0.4° |
| --- | --- | --- | --- |
| Annular Ø in focus at f = 100 mm | 157 µm | 314 µm | 628 µm |

Simulations were carried out to illustrate the advantages of the beamforming according to the invention using Siemens-star-shaped facet structures.

Figure 6:
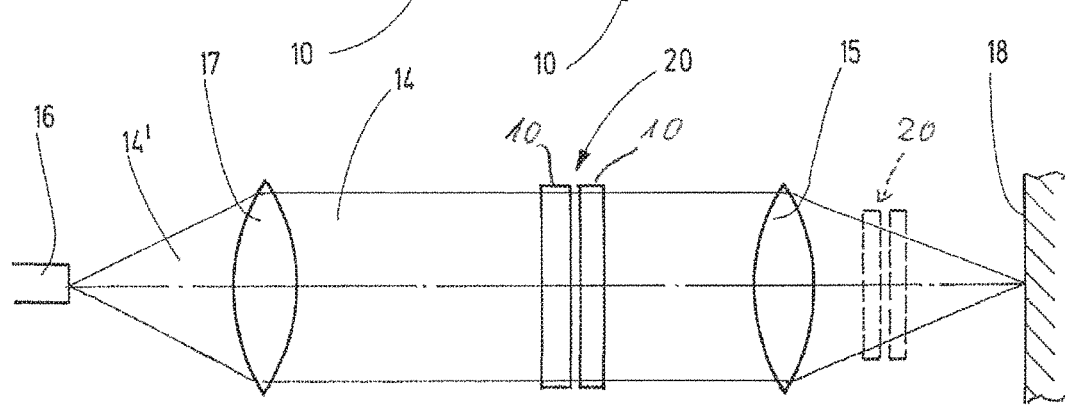
FIG. 6 shows a beam guiding and focusing system as used for laser machining in a laser machining head, in the laser beam path of which an adjusting optics with two plate-shaped optical elements is arranged.

The basic structure of the beam guiding and focusing optics is shown in FIG. 6 and technical data are given in the following table:

| Beam source | Step-index fibre, core-Ø = 100 µm, emitted NA = 0.12 |
| --- | --- |
| Beam source (alternatively) | Step-index fibre with annular core, Ø$_{Outside}$ = 600 µm, Ø$_{Inside}$ = 150 µm, NA = 0.12 |
| Collimation | Perfect converging lens, f = 100 mm |
| Focusing | Perfect converging lens, f = 100 mm |

Here, Ø=diameter and NA=numerical aperture.

As shown in FIG. 6, a divergent laser light bundle 14' emerging from a an optical fibre 16 is transformed by a collimator optics 17 into a parallel laser light bundle 14, which is focused onto a workpiece 18 by the focusing lens 15. According to FIG. 6, an adjusting optics 20, i.e., a refractive optics for adjusting the intensity distribution, is inserted into the parallel laser light bundle 14. For the following simulation, a single Siemens star optics with facet structure was used, as shown in FIG. 2.

With this basic structure, the following four configurations were examined:

| # | Beam source | Beamforming optics |
| --- | --- | --- |
| 1 | Core-Ø = 100 µm | None |
| 2 | Core-Ø = 100 µm | Siemens star optics between the lenses, 36 facets à 10° angular range with ±0.4° Inclination |
| 3 | Core-Ø = 100 µm | Axicon between the lenses, inclination angle 0.1° |
| 4 | Annular core, Ø$_{Outside}$ = 600 µm, Ø$_{Inside}$ = 150 µm | None |

In the simulation, the energy distribution or the beam profile was determined 3 mm before the focal point, at the focal point, and 3 mm behind the focal point. In the first case, the beam guiding and focusing optics according to FIG. 6 is used without adjusting optics. In the second example, a Siemens star optics according to the invention was placed between the two lenses. In a third simulation, an axicon, that is, a cone with an inclination angle of 0.1°, was arranged in the beam path. As an alternative possibility of beamforming by means of fibres, a step-index fibre with a ring core was used, wherein again no further beamforming elements were introduced into the beam path. The simulation results are shown in FIG. 8.

Thus, the simulations show that the Siemens-star-shaped facet structure of a plate-shaped optical element according to the invention, i.e., the Siemens star optics, is best suited to produce an annular profile over as wide a range as possible before and after the focal plane.

When a single Siemens star optics 10 is inserted into the beam path of the laser beam 14, as shown in FIG. 2, the annular power density distribution corresponding to the above configuration #2 (annulus) is obtained. In order to obtain the point-shaped power density distribution according to the above configuration #1 (spot), the Siemens star optics 10 needs only be taken out of the beam path of the laser beam 14. In order to switch between the spot and annulus modes and back to the spot mode, the single Siemens star optics 10 needs only be inserted into the beam path of the laser beam 14 and then removed again, as indicated by the double arrow D in FIG. 2.

If the single Siemens star optics 10 inserted into the beam path is rotated by a suitable rotary drive, as explained in more detail below in conjunction with a further embodiment of the invention, it is possible to determine the power density distribution in the annular profile, in particular in the focal plane in the circumferential direction, because the annular profile itself rotates in the focal plane, i.e., because the individual light points or spots of the annular profile substantially revolve around the optical axis. Herein, the temporal distribution of the power density at one point of the ring profile corresponds to the spatial distribution of the power density in the circumferential direction. This not only allows compensating for differences in power density caused by the point structure but also the differences based on manufacturing tolerances.

In order to achieve a continuous mixing ratio between point-shaped and annular profiles of the laser focus, two Siemens star optics of the type described with reference to FIGS. 1 to 4 are used according to the invention.

Figure 5:
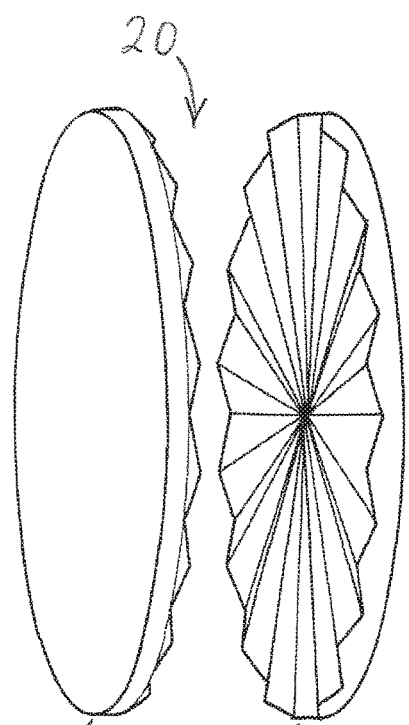
FIG. 5 shows an arrangement of two plate-shaped optical elements for forming an adjusting optics according to the invention.

The series connection of two Siemens star optics 10 to form an adjusting optics 20 according to the invention for adjusting the intensity distribution (see FIG. 5) results in an addition of the beam deflections of the individual Siemens star optics 10. Depending on the relative angular position of the two Siemens star optics 10, three different cases arise. When the Siemens star optics 10 face each other without twist or twisted by a multiple of the facet period angle, so that oppositely inclined facets are facing each other, the beam deflections are added constructively and an annular profile is produced the diameter of which is twice as large as that of a single Siemens star optics 10. When the Siemens star optics are twisted with respect to one another by half the facet period angle so that similarly inclined facets face each other, i.e., when the roofs of the one Siemens star optics 10 are facing the valleys of the other Siemens star optics 10 and vice versa, the beam deflections of the first Siemens star optics 10 are almost exactly cancelled by the second Siemens star optics 10. In this position, the two Siemens star optics 10 act like a plane-parallel plate. As a result, a point-like focus is produced in the focal plane, as if there were no adjusting optics 20. In addition, all other angular positions which are twisted with respect to one another are also possible, so that each facet opposes both similarly and oppositely inclined facets. Therefore, a mixed profile consisting of an annulus and a point is produced. The power distribution over the beam profile depends on the respective overlap regions.

Corresponding simulations have also been carried out for suchlike adjusting optics 20 according to the invention. For this, the adjusting optics 20, as shown in FIG. 6, was inserted between the collimator lens 17 and the focusing lens 15. As shown, the simulations were only carried out for an arrangement of the adjusting optics 20 in the collimated beam area. As indicated by dashed lines in FIG. 6, however, the deflection principle according to the invention should also function in the converging beam region or in the diverging beam region (not shown).

In the simulation with an adjusting system 20 having two elements, plate-shaped Siemens star optics 10 were used, the Siemens-stern-shaped facet structure of which has facets with an angular range of 10° and an inclination angle of the facets of ±0.2°. Although the elements may basically be arranged in such a way that any surfaces can face each other, the optical elements are arranged herein in such a way that they face one another at a distance of 1 mm with their faceted surfaces, similar to FIG. 5. This has the advantage that the deflection effects complement each other or cancel out, as shown by the last two rows in FIG. 9.

In order to be able to determine the suitability for use in laser processing as accurately as possible, manufacturing tolerances were taken into account during the simulation. For this purpose, the radially extending tips of the roofs and the troughs of the valleys were flattened with an azimuthal width of 10 µm. This results in a beam portion which is not subject to beamforming and is thus always imaged as a point in the centre of focus. According to the simulation, this portion is of 2% at maximum, which is quite negligible in the use in material machining.

In the simulation, it became apparent that the individual image of the facets can no longer be recognized even at a small axial distance from the focal plane (0.35 µm) and, causing a nearly homogeneous annular profile to arise. For illustrative purposes, the beam profiles in two planes were calculated in the following table. FIG. 9 shows the corresponding results for various relative angles between the two elements.

Figure 7:
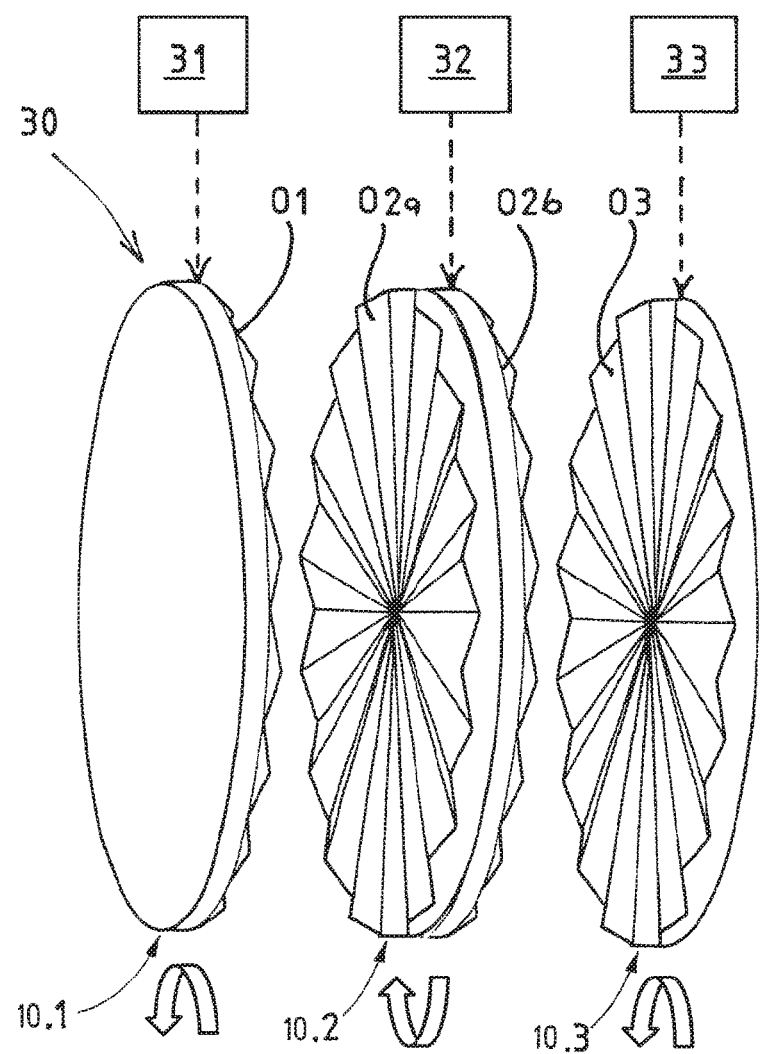
FIG. 7 shows an arrangement of three plate-shaped optical elements according to the invention for forming an adjusting optics, wherein the central one is patterned on both sides.

The adjusting optics 20 according to the invention may, however, also be constructed with more than two elements, as is shown, for example, in FIG. 7. In order to obtain a complete compensation of the beam deflections of the individual elements in this case and in order to be able to optimally combine the different beam profiles, it is advantageous when the inclination angle of the facets of an element is twice as large as the inclination angle of the facets of the two other optical elements in which the angle of inclination is equal. If an adjusting optics is to be constructed with four elements, the inclination angle of the facets for the fourth element must be as large as the sum of the inclination angles of the facets of the three other elements. When, for example, the inclination angle is ±0.1° for the first two elements and the angle for the third element is ±0.2°, the inclination angle of the facets for the fourth element should be chosen to be ±0.4°.

In a simulation, an adjusting optics including three optical elements having Siemens-star-shaped facets, i.e., including three Siemens star optics 10, was used, wherein the facets of one of the elements were twice as steep)(±0.2° as the facets of the other two elements, which were only inclined by ±0.1°. These two were individually rotatable. As a result, a point-shaped focus as well as two annuli with different diameters (600 µm and 300 µm) as well as any desired mixed shapes may be produced. As described above, a possible manufacturing tolerance was also taken into account here by flattening the tips and troughs.

The results of the simulation are shown in FIGS. 10A and 10B.

In FIGS. 10A and 10B, the first row shows the relative position of the elements, in which the beam deflections are optimally added, which leads to the largest diameter achievable with the device. Rows 2 and 3 show the results at angular positions in which the effects of the two elements cancel out optimally at the same inclination angles so that the annular diameter is determined only by the inclination angle of the facets of the element with a large inclination angle. The fourth row shows what the intensity distribution is like in the focus when the elements are twisted relative to each other in such a way that their beam deflections cancel optimally. This result corresponds to the comparative example shown in the last row of FIG. 10B without adjusting optics.

The remaining rows of FIGS. 10A and 10B show arbitrary mixed shapes.

When an adjusting optics according to the invention is used, for example, in a laser cutting head with a collimator lens and a focusing lens with a respective focal length of 100 mm which is supplied with laser radiation via a 100 µm fibre with a numerical aperture of 0.12, rapid switching between the states annulus and spot (point) is possible with the adjusting optics including two elements according to the invention. This makes it possible to switch between the "thick plate" operating mode, which requires a large-diameter focus, and the "thin plate" operating mode, which only requires a point-shaped laser focus. As has been shown by the simulations, it is also possible, by rotating by less than one facet, i.e., by an angle which is smaller than the angle of a facet, to produce mixed states of annular and point-shaped beam characteristics so that the optimum energy distribution in the beam profile may be selected during laser cutting as required.

When, in a practical embodiment of the invention, an adjusting optics is used the plate-like optical elements (Siemens star optics) of which have a diameter of 30 mm and include 18 double facets, i.e., 36 facets with a sector angle of 10°, the edge is displaced by 2.6 mm when twisting the two Siemens star optics by one facet with respect to one another. Such a displacement can be realized at a high speed when, for example, the movable optics is mounted in a hollow shaft which is not shown in detail and which is driven by a stepping motor which can move the edge of the rotatable Siemens star optics at a speed of v=250 mm/s.

Then, a switching time of approximately 10 ms is obtained, so that switching from annulus to spot or vice versa can be performed virtually without interruption.

However, with an adjusting optics 20 which is constructed from two or more Siemens star optics 10, it is not only possible to switch from annulus to spot or vice versa, but also to modulate the spatial intensity distribution of a laser beam focused on a workpiece at high frequency in order to increase the quality during laser cutting and laser welding. For this purpose, an adjusting system 20 with two or more successive Siemens star optics 10 is required, at least one of which is rotatably mounted about the optical axis and can be caused to rotate. As stated above, the adjusting optics 20 may be arranged in the collimated, divergent or convergent part of the beam path.

In order to switch the produced intensity distribution in the focal plane from spot to annulus, a relative rotation of the Siemens star optics 10 with N double segments (double facets) of 360°/2N is sufficient. At a relative rotation of 360°/N, a change from spot to annulus and back to spot takes place. This corresponds to a period of oscillation.

It follows that the modulation frequency of the intensity distribution corresponds to N times the relative rotational frequency of the Siemens star optics 10. Thus, a pair of Siemens star optics 10 provides an optical transmission which provides, even at small rotational frequencies of one or all of the Siemens star optics 10, a high modulation frequency for the intensity distribution of the laser beam 14 in the focal plane.

When, for example, an adjusting optics 20 with two Siemens star optics 10, the Siemens star surfaces of which each have N=20 double facets or segments, and a drive for at least one of the Siemens star optics 10 with a rotational frequency of 100 Hz are used, the intensity distribution is modulated between the modes spot and annulus at a frequency of 2 kHz.

In particular, the following operating modes are conceivable:
  Only one of the Siemens star optics 10 is rotated at the frequency f. The modulation frequency then corresponds to N*f.
  Both Siemens star optics 10 are rotated with respect to one another at the rotational frequencies f1 and f2. The modulation frequency corresponds to N*(f1+f2).
  If more than two systems are used,
  annular intensity distributions with different diameters can be produced, as already explained above; also
  the modulation frequency can be further increased.

For this purpose, every Siemens star optics must always rotate in the opposite direction to its adjacent Siemens star optics. The modulation frequency with the rotational frequencies $f_i$ is obtained as $N*(\Sigma_M f_i)$. When, for example, three Siemens star optics, each with N=20 double facets and a rotation frequency of 100 Hz, are used, the intensity distribution is modulated between the modes spot and annulus at a frequency of 6 kHz.

As an example, a configuration as shown in FIG. 7 is to be used. As shown in FIG. 7, an adjusting optics 30 includes three screen star optics 10.1, 10'.2 and 10.3, the central Siemens star optics 10'.2 being patterned on both sides. A total of four Siemens star surfaces O1, O2a, O2b, O3 are thus provided with N double-facets each. The two oppositely disposed Siemens star surfaces O1 and O2a have the same facet pitch or inclination angle $\beta_1$. The two other mutually opposing screening surfaces O2b and O3 have the same facet pitch or inclination angle $\beta_2$, wherein the inclination angle $\beta_1$ is different from the inclination angle $\beta_2$ in a manner not specified in detail. By rotating the Siemens star optics 10.1 relative to the Siemens star optics 10'.2, the common annular shape of the Siemens star surfaces O1 and O2a can be switched. The same applies to the Siemens star optics 10'.2 and 10.3 and the Siemens star surfaces O2b and O3.

As indicated in FIG. 7, a rotary drive 31, 32 or 33 is assigned to each of the three Siemens star optics 10.1, 10'.2 and 10.3, so that all three Siemens star optics 10.1, 10'.2 and 10.3 are rotatable at the frequency f. The direction of rotation of the central Siemens star optics 10'.2 is, in this case, opposite to the direction of rotation of the other two, as indicated by the direction of rotation arrows P. If different rotational frequencies of the three Siemens star optics 10.1, 10'.2 and 10.3 are allowed, in particular the number of intensity distributions produced during a period is increased.

A selection of the various operating modes of the arrangement described with reference to FIG. 7 is given by the following table:

| Position 10.1 | Position 10'.2 | Position 10.3 | Intensity distributions during a period | Modulation frequency |
| --- | --- | --- | --- | --- |
| rotating at f | at rest, spot | | $\varnothing_1$ Sp | N*f |
| rotating at f | at rest, annulus | | $\varnothing_2 \varnothing_3$ | N*f |
| at rest, spot | | rotating at f | $\varnothing_2$ Sp | N*f |
| at rest, annulus | | rotating at f | $\varnothing_1 \varnothing_3$ | N*f |
| at rest | rotating at f | at rest, in phase with 10.1 | $\varnothing_3$ Sp | N*f |
| at rest | rotating at f | at rest, 180° PV relative to 10.1 | $\varnothing_1 \varnothing_2$ | N*f |
| rotating at f | at rest | rotating at f, in phase with 10.1 | $\varnothing_3$ Sp | 2*N*f |
| rotating at f | at rest | rotating at f, 180° PV relative to 10.1 | $\varnothing_1 \varnothing_2$ | 2*N*f |
| rotating at f | rotating at f | rotating at f, in phase with 10.1 | $\varnothing_3$ Sp | 3*N*f |
| rotating at f | rotating at f | rotating at f, 180° PV relative to 10.1 | $\varnothing_1 \varnothing_2$ | 3*N*f |

Here, PV=phase shift, Sp=spot-shaped intensity distribution, and $\varnothing_i$=diameter of the annular intensity distribution As a result of the interplay of the continuous rotation of the Siemens star optics 10; 10.1, 10'.2, 10.3 with the optical transmission effect of one or more pairs of Siemens stars, the produced intensity distribution in the focus is modulated at N times the rotational frequency or at N times the sum of the rotational frequencies, where N is the number of double-facets per Siemens star optics 10; 10.1, 10'.2, 10.3.

Due to the optical transmission effect, the requirements for the rotational speed are low. In order to rotate one or more Siemens star optics with double-digit or triple-digit rotational frequency, electric drives with different drive mechanisms, which are available on the market, can be used as rotary drives.

As an alternative to an electric drive, it is also conceivable to implement a rotary drive by means of compressed air. The gas supply is generally provided, since compressed air (and/or cutting gas) is usually available in the area of the laser machining head.

In the market, there are also rotary drives which can rotate an optics such as a Siemens star optics at particularly high rotational frequencies of up to 6 kHz. If applied to the above example with two Siemens star optics with N=20 double facets, modulation frequencies of up to 120 kHz are achieved.

Starting at a modulation frequency in the 2-digit kHz range, the sheet to be machined only experiences the intensity distribution averaged over a modulation period, since, due to the relative inertia of the heat conduction, the input power cannot be redistributed quickly enough. The modulation of the intensity distribution thus acts as a continuous beam widening and can therefore replace or supplement complex zoom systems.

In all cases and configurations, the laser machining head according to the invention is also preferably suitable for thin-plate welding or cutting, since the annular shaping can be deactivated by means of a suitable fixed angle position of all the Siemens star optics used in order to operate the laser machining head in the spot mode.

The invention claimed is:

1. A device for machining material by laser radiation, comprising:
    a focusing optics for focusing a laser beam onto a workpiece, and
    an adjusting optics for adjusting an intensity distribution including at least one plate-shaped optical element having a circular pattern of sector-shaped facets, wherein adjacent ones of the facets are inclined in opposite directions along a circumferential directions, and each of the facets is configured to:
    adjoin an adjacent facet at a same height as each of the facet at an edge along a roof line extending in a radial direction, and
    adjoin another adjacent facet at an opposite edge along a valley line extending in another radial direction.

2. The device according to claim 1, wherein said plate-shaped optical element of said adjusting optics can be moved into and out of the beam path of said laser beam.

3. The device according to claim 1, wherein said adjusting optics includes at least two plate-shaped optical elements, each having a circular pattern of sector-shaped facets which, in the circumferential direction, are alternately inclined with respect to the respective plate plane, wherein said at least two plate-shaped optical elements are arranged one behind another in the beam path of said laser beam and are rotatable relative to one another in the circumferential direction.

4. The device according to claim 3, wherein said two plate-shaped optical elements of said adjusting optics face each other with their sector-shaped facet patterns.

5. The device according to claim 3, wherein said two plate-shaped optical elements of said adjusting optics are rotatable about an axis which is coaxial with a central axis of a laser beam bundle.

6. The device according to claim 3, wherein the sector-shaped facet patterns of said two plate-shaped optical elements of said adjusting optics have the same number of facets, and the facet surfaces are inclined by the same angle.

7. The device according to claim 3, wherein said adjusting optics comprises a further plate-shaped optical element having a sector-shaped facet pattern.

8. The device according to claim 7, wherein said further plate-shaped optical element has a sector-shaped facet pattern on both sides and is arranged between the two first plate-shaped optical elements.

9. The device according to claim 7, wherein said further plate-shaped optical element has a sector-shaped facet pattern which is different from the sector-shaped facet pattern of said two first plate-shaped optical elements.

10. The device according to claim 9, wherein the facet surfaces of said further plate-shaped optical element are inclined by an angle with respect to the plate plane which differs from an inclination angle of said two first plate-shaped optical elements is as large as a sum of the inclination angles of said two first plate-shaped optical elements.

11. The device according to claim 9, wherein the facets of said further plate-shaped optical element have an azimuthal width which is different from the azimuthal width of the facets of said two first plate-shaped optical elements.

12. The device according to claim 1, wherein all sector-shaped facets of a plate-shaped optical element have the same azimuthal width.

13. The device according to claim 1, wherein surfaces of the sector-shaped facets of said plate-shaped optical elements are planar or curved or have two or more differently inclined portions.

14. The device according to claim 1, wherein an inclination angle of facet surfaces with respect to the plate plane is between ±0.1° and ±0.6°.

15. The device according to claim 1, wherein the number of facets is 18 to 72.

16. The device according to claim 1, wherein a collimator optics is provided for widening said laser beam, and said adjusting optics is arranged between said collimator optics and said focusing optics.

17. The device according to claim 16, wherein a rotary drive is assigned to each of said plate-shaped optical elements.

18. The device according to claim 1, wherein a rotary drive is assigned to at least one of said plate-shaped optical elements so that the plate-shaped optical element is driven during a laser machining process so as to rotate at a constant or variable speed.

19. The device according to claim 18, wherein said rotary drives can be driven independently of one another, so that the rotational speed and the direction of rotation of each of said plate-shaped optical elements are selected.

* * * * *